(12) United States Patent
Buissette et al.

(10) Patent No.: US 12,241,009 B2
(45) Date of Patent: Mar. 4, 2025

(54) MODIFIED PHOSPHORS AND COMPOSITIONS THEREOF

(71) Applicant: RHODIA OPERATIONS, Aubervilliers (FR)

(72) Inventors: Valérie Buissette, Paris (FR); Franck Aurissergues, Argenteuil (FR); Thierry Le Mercier, Rosny-sous-Bois (FR)

(73) Assignee: RHODIA OPERATIONS, Paris (FR)

( * ) Notice: Subject to any disclaimer, the term of this patent is extended or adjusted under 35 U.S.C. 154(b) by 0 days.

(21) Appl. No.: 17/494,334

(22) Filed: Oct. 5, 2021

(65) Prior Publication Data

US 2022/0098476 A1   Mar. 31, 2022

Related U.S. Application Data

(63) Continuation of application No. 15/501,656, filed as application No. PCT/EP2015/067855 on Aug. 3, 2015, now abandoned.

(30) Foreign Application Priority Data

Aug. 4, 2014   (EP) ..................................... 14306234
Feb. 6, 2015   (EP) ..................................... 15305178

(51) Int. Cl.
| | | |
|---|---|---|
| C09K 11/02 | (2006.01) | |
| A01G 9/14 | (2006.01) | |
| B01J 13/04 | (2006.01) | |
| C08K 9/04 | (2006.01) | |
| C09K 11/77 | (2006.01) | |
| G02F 1/1335 | (2006.01) | |
| H01L 31/055 | (2014.01) | |

(52) U.S. Cl.
CPC .............. *C09K 11/025* (2013.01); *A01G 9/14* (2013.01); *B01J 13/04* (2013.01); *C08K 9/04* (2013.01); *C09K 11/7734* (2013.01); *H01L 31/055* (2013.01); *C08K 2201/001* (2013.01); *C08K 2201/011* (2013.01); *Y02E 10/52* (2013.01)

(58) Field of Classification Search
CPC ... G02F 1/133507; C08K 9/04; C08K 5/5313; C08K 5/0008; C08K 2201/001; C08K 2201/011; C09K 11/02; C09K 11/025; C09K 11/7734; C09K 11/7706; C09K 11/7749; C09K 11/7758; C09K 11/7764; C09K 11/74; C09K 11/92; C09K 11/565; C09K 11/883
See application file for complete search history.

(56) References Cited

U.S. PATENT DOCUMENTS

| | | | | |
|---|---|---|---|---|
| 4,707,453 A | * | 11/1987 | Wagner | G01N 33/533 436/829 |
| 2002/0195578 A1 | * | 12/2002 | Yanagita | G21K 4/00 250/581 |
| 2003/0148695 A1 | * | 8/2003 | Kawamura | H01J 9/227 445/24 |
| 2005/0260764 A1 | * | 11/2005 | Grigsby, Jr. | G01N 21/6428 436/172 |
| 2007/0295116 A1 | * | 12/2007 | Le Mercier | C09K 11/7777 73/866 |
| 2008/0014463 A1 | * | 1/2008 | Varadarajan | C09K 11/667 427/64 |
| 2010/0164365 A1 | * | 7/2010 | Yoshino | C09K 11/77342 313/503 |
| 2013/0075692 A1 | * | 3/2013 | Naasani | H01L 33/501 257/E33.059 |

* cited by examiner

*Primary Examiner* — Matthew E. Hoban
*Assistant Examiner* — Lynne Edmondson
(74) *Attorney, Agent, or Firm* — Osha Bergman Watanabe & Burton LLP

(57) ABSTRACT

A modified phosphor is described comprising phosphor particles and at least one amphiphilic agent. Compositions comprising the modified phosphor and at least one polymer are also described.

21 Claims, 2 Drawing Sheets

Figure 1:
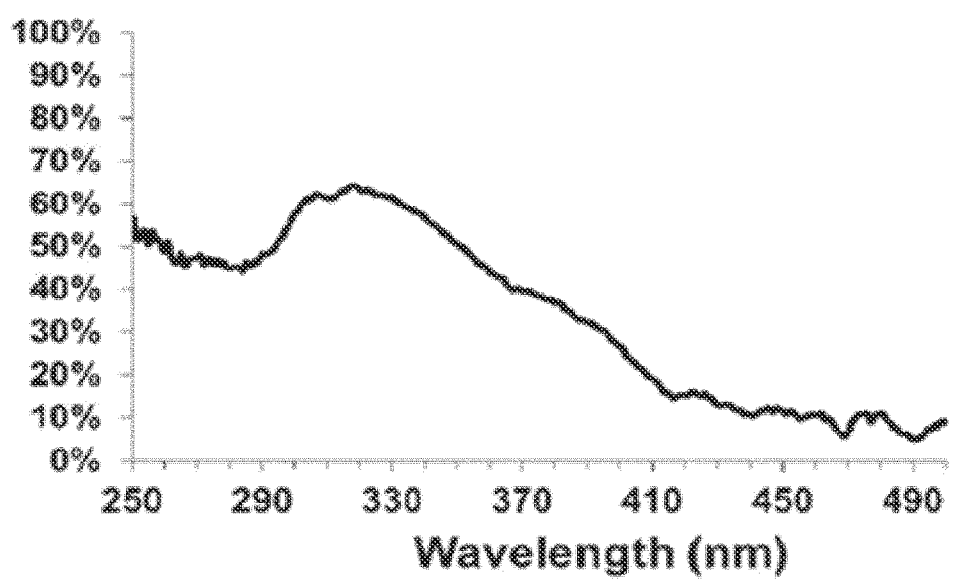

13VCL051　　　　　　　　　EHT = 5.00 kV　Signal A = InLens　26 Nov 2013
　　　Mag = 5.00 K X　WD = 5.5 mm　Photo No. = 5030　　18:17:04

13VCL052　　　　　　　　　EHT = 5.00 kV　Signal A = InLens　26 Nov 2013
　　　Mag = 5.00 K X　WD = 5.9 mm　Photo No. = 5030　　18:34:48

MODIFIED PHOSPHORS AND COMPOSITIONS THEREOF

CROSS-REFERENCE TO RELATED APPLICATIONS

The present application claims the priority of European patent applications EP 14306234.7 and EP 15305178.4 filed respectively on 4 Aug. 2014 and on 6 Feb. 2015, the content of which being entirely incorporated herein by reference for all purposes. In case of any incoherency between the present application and the EP applications that would affect the clarity of a term or expression, it should be made reference to the present application only.

TECHNICAL FIELD

The present invention relates to inorganic phosphors having a modified surface, to their manufacture and their uses in polymeric compositions and articles.

Technical Problem

Inorganic phosphors, hereinafter referred to as "phosphors", have been known for many years. Among well-known inorganic phosphors mention can be made of phosphates and aluminates of mixed elements, such as rare earth elements.

The luminescence and electronics fields are currently experiencing considerable developments, for instance in the development of plasma systems (displays and lamps) for new techniques in displays, lighting or marking. Thus, apart from their luminescence property, phosphors are more and more required to have specific morphology or particle size characteristics to facilitate their use in the required applications.

More precisely, it would be desirable in certain applications to obtain materials in the form of thin, transparent and luminescent films. To this aim it would be convenient to have the phosphor dispersed in a polymer without loss of the phosphor luminescent characteristics. Green-houses as well as solar panels are just two non-limiting examples of these types of applications.

It has now been found that it is possible to modify the surface of a large range of phosphors without reducing their optical properties and thereby improving their dispersibility in a polymer matrix.

Definitions

For the purpose of the present invention the expression "rare earth elements" identifies the elements of the group consisting of yttrium and the elements of the Periodic Table with atomic numbers between 57 and 71 inclusive.

The external quantum yield (EQ) for a given excitation wavelength $\Delta_{exc}$ is calculated as the ratio, expressed as percentage, between the integral of the photon emission of the phosphor over the range of emission 400-900 nm and the integral of the photon emission of a phosphor of reference over the same emission range, both phosphors being excited at the same excitation wavelength $\Delta_{exc}$. The measure of photon emission may be carried out on a dried suspension of the phosphor using a spectrofluorometer of the type Jobin-Yvon.

The phosphor of reference (EQ=100%) is a phosphor obtained according to the procedure described in Example 1 in WO 2004/106263. The raw materials used are a boehmite sol specific surface area of 265 m²/g containing 0.157 mol Al per 100 g of gel, a 99.5% barium nitrate, a 99% magnesium nitrate and a europium nitrate solution containing 2.102 mol/l of Eu (d=1.5621 g/mol), 200 ml of boehmite sol are made (ie 0.3 mol of Al). Moreover, the salt solution (150 ml) contained: 7.0565 g of $Ba(NO_3)_2$; 7.9260 g of $Mg(NO_3)_2$ and 2.2294 g of the $Eu(NO_3)_3$ solution. The final volume is made up to 405 ml (ie 2% of Al) with water. After mixing the sol with the salt solution, the final pH is 3.5. The mixture obtained is spray-dried in an APV® spray-drier with an outlet temperature of 145° C. The dried powder is calcined at 900° C. for 2 hours in air. The powder thus obtained is white. The product is of formula $Ba_{0.9}Eu_{0.1}MgAl_{10}O_{17}$ and is a precursor of the reference phosphor. The precursor is mixed with 1 wt % (by weight) of $MgF_2$ (1 part of $MgF_2$ and 99 parts of precursor). The mixture thus obtained is calcined under an $Ar—H_2$ (5% by volume) atmosphere at 1550° C. for 4 hours. The calcined product is then washed at 60° C. in diluted nitric acid for 2 hours under stirring, filtered and dried in an oven at 100° C. for 12 hours. The resulting phosphor is the reference phosphor.

The mean particle diameter $d_{50}$, is defined as the diameter of at least 50% of the particles, as determined by a laser diffraction technique using a laser particle size analyzer (volume distribution) performed on a diluted suspension (aqueous solution or solvent) of the phosphor with no ultrasound sonication and no dispersing agent. The mean particle diameter $d_{50}$ is thus the size that splits the distribution in volume with half above and half below this diameter. The aqueous solution (eg water) or solvent are chosen so that the particles do not settle and remain in suspension. The aqueous solution or the solvent are also chosen so that the particles do not dissolve and remain intact. This technique makes it possible to obtain distributions in volume from which the parameters like eg $d_{50}$, $d_{84}$ and $d_{16}$ are obtained.

The term "distribution index" is understood to mean the ratio:

$$\sigma/m=(d_{84}-d_{16})/2d_{50}$$

in which:
$d_{84}$ is the diameter of the particles for which 84% of the particles have a diameter of less than $d_{84}$ (as determined by laser diffraction technique);
$d_{16}$ is the diameter of the particles for which 16% of the particles have a diameter of less than $d_{16}$ (as determined by laser diffraction technique); and
$d_{50}$ is the mean diameter of the particles.

The term "absorption" is used to refer to the percentage of light absorbed over the range of wavelengths comprised between 250 nm and 500 nm, measured by diffuse reflection on a spectrometer UV-Visible (UV-VIS) of the type Perkin Elmer Lambda 900.

The absorption is obtained from a diffuse reflection spectrum. Such a spectrum can be recorded using a Jobin Yvon HORIBA fluoromax-3 spectrometer equipped with a Xenon lamp and 2 monochromators (one for excitation wavelength and one for emission wavelength) able to work synchronously. A first reflection spectrum of $BaSO_4$ is recorded between 250 nm and 500 nm. $BaSO_4$ spectrum represents 100% of light reflection (referred to as "white"). A second reflection spectrum of black carbon is recorded between 250 nm and 500 nm. Black carbon spectrum represents 0% of light reflection (referred to as "black"). The sample reflection spectrum is recorded between 250 nm and 500 nm. For each wavelength, the following relationship is calculated:

A=($R_{white}$−$R_{sample}$)/($R_{white}$−$R_{black}$) which represents the absorption spectrum at each wavelength.

FIGURES

FIG. 1 corresponds to the absorption spectrum of the modified phosphor MP1 of example 1.

Figure 2:
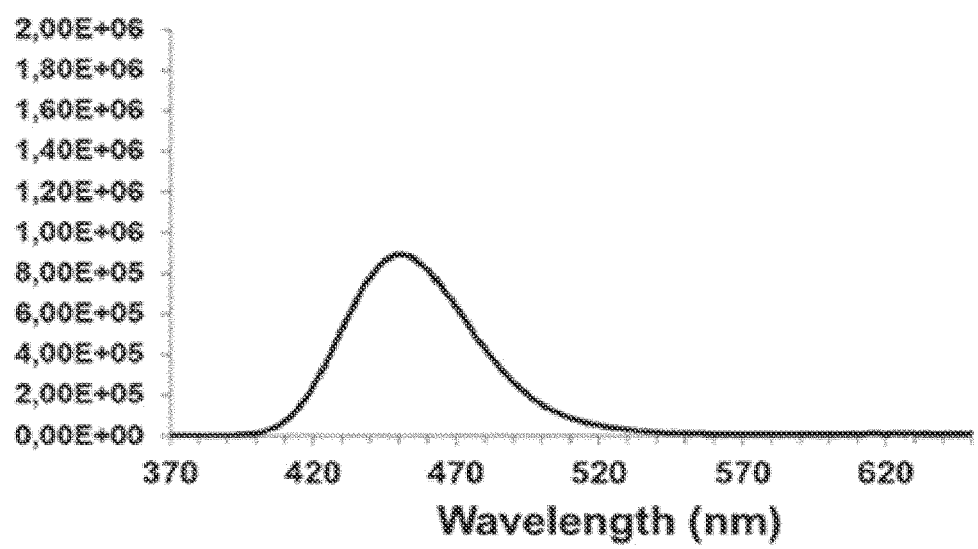

FIG. 2 corresponds to the emission spectrum of the modified phosphor MP1 of example 1.

Figure 3:
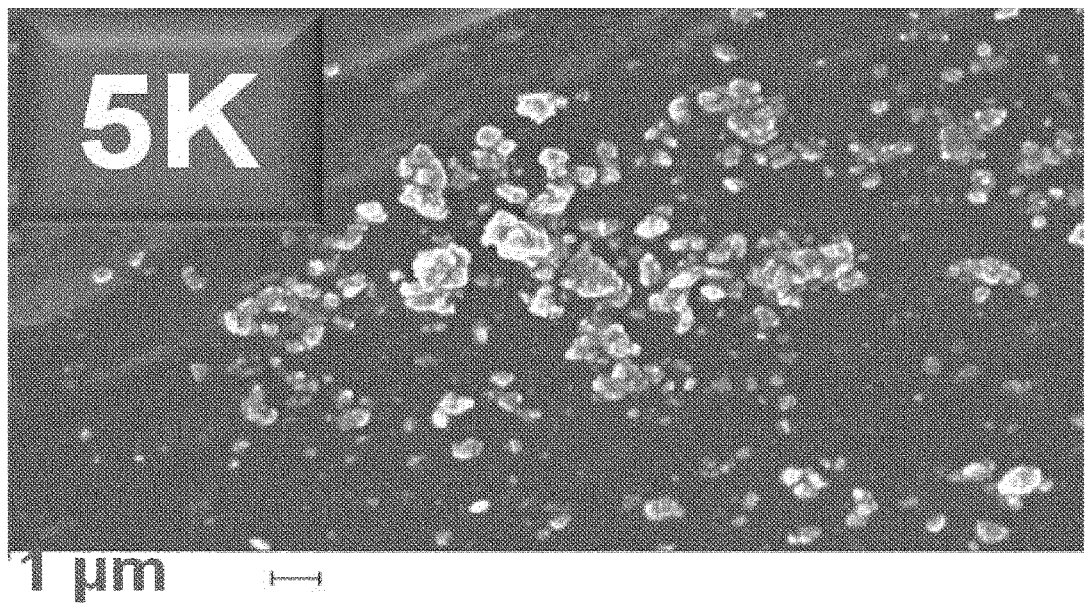

FIG. 3 corresponds to an observation by electron microscopy (magnification 5000) of a composition comprising the ethylene/vinyl acetate and the reference phosphor P1 (unmodified).

Figure 4:
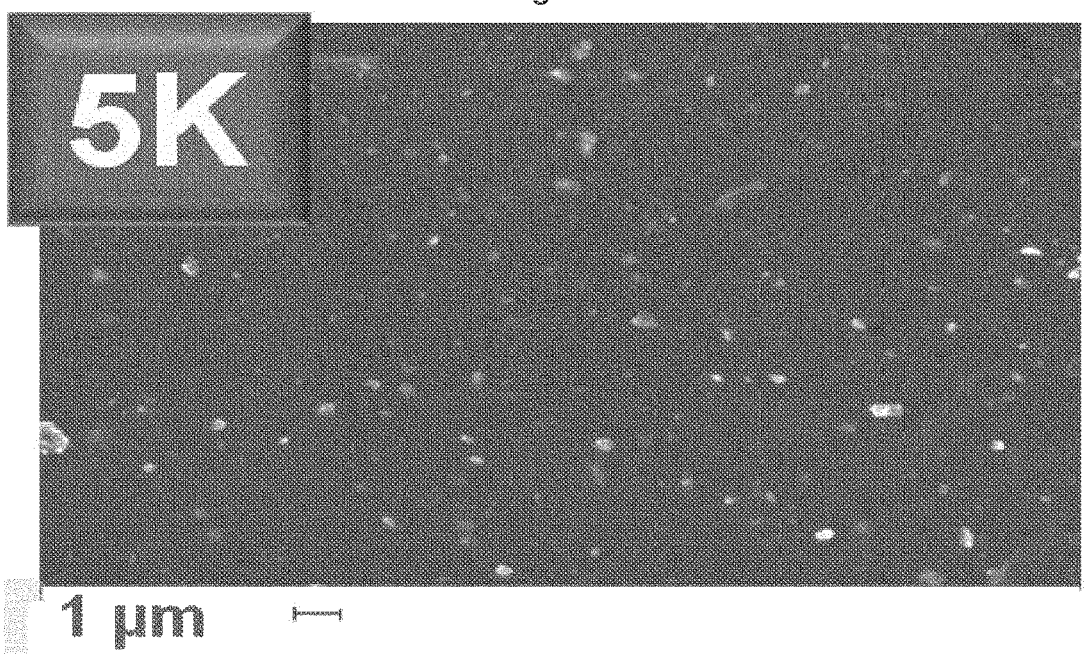

FIG. 4 corresponds to an observation by electron microscopy (magnification 5000) of a composition comprising the ethylene/vinyl acetate and the modified phosphor MP1.

BACKGROUND ART

WO 2012/032880 describes a wavelength-converting resin comprising inorganic fluorescent substance of formula:

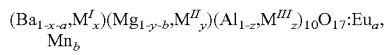
$(Ba_{1-x-a}, M^I_x)(Mg_{1-y-b}, M^{II}_y)(Al_{1-z}, M^{III}_z)_{10}O_{17}:Eu_a, Mn_b$ The particle size is not specifically limited and is disclosed to be preferably between 1-1000 nm. The monomer of the resin can be an addition-polymerization monomer, more particularly a vinyl compound that comprises an ethylenic unsaturated bond. WO 2012/032880 discloses that the inorganic fluorescent substance can be coated with a vinyl-based polymer dispersant containing hydrophilic structural units and hydrophobic structural units.

CN 102911612 discloses a fluorescent EVA (ethylene vinyl acetate) glue film. The formula of the fluorescent EVA glue film comprises EVA of which the vinyl acetate content is 26-35 wt % and a polymerizable fluorescent monomer, wherein the polymerizable fluorescent monomer is a mixture formed by any one or at least two of acrylates or methylacrylates of Eu, Y, Sm, Ce, Tb, Dy, Gd, La and Sc or organic metal chelates of acrylates and methylacrylates. The formula of the fluorescent EVA glue film can further comprise additive components, i.e., oxide crosslinking agent, assistant crosslinking agent, hindered amine light stabilizer, assistant antioxidant, tackifier, plasticizer and antacid. According to the fluorescent EVA glue film, not only the package efficiency of components can be obviously improved, but also the aging function of ultraviolet light to photovoltaic components can be greatly reduced, and therefore, the fluorescent EVA glue film can be widely used for the package of various photovoltaic components.

WO 2013/171272 describes a multilayer encapsulant film for photovoltaic modules. It discloses a polymer encapsulant layer comprising a luminescence downshifting agent. Organic or inorganic luminescence downshifting agents are disclosed, in particular quantum dots with an average size of less than 75 nm.

US 2013/0075692 describes light-emitting layers based on "quantum dot" or nanocrystalline type particles dispersed in a polymer which may be EVA, PET, PE, PP, PC, PS, PVDF, etc. Quantum dots are particles for which the size is critical in order for there to be emission of light. The size of the particles varies from 2 nm to 10 nm in general (in [0006] of US 2013/0075692: 2-50 nm). The composite according to the invention does not comprise particles of quantum dot type.

WO 2009/115435 describes submicron particles of barium magnesium aluminate that can be used in luminescent devices or as markers in semi-transparent inks. The particles may be incorporated into a polymer matrix such as PC, PMMA or a silicone. That application does not therefore describe the same polymers as those of the present application. The weight fraction of particles may be between 20% and 99%, that is to say a proportion greater than that envisaged in the present invention. The thickness of the layer comprising the particles dispersed in the polymer is between 30 nm and 10 µm. Furthermore, no mention is made of the photovoltaic application.

FR 2993409 describes a transparent matrix containing a plurality of optically active constituents that absorb light energy in a first absorption wavelength and re-emit energy in a second wavelength greater than the first wavelength. The transparent matrix may be made of PMMA, PVC, silicone, EVA or PVDF.

U.S. Pat. No. 4,257,676 discloses a device for collecting light comprising organic or inorganic fluorescent particles which exhibit finite dipole moments with different values in a basic and excited state dispersed in an amorphous medium based on a polysilicate or polyphosphate. There is no disclosure or a phosphor as in claim 1 with a rare earth element, zinc or manganese. There is also no disclosure of a polymer which can be extruded in the form of a film.

WO 2008/074869 discloses nanoparticles the surface of which has been modified so as to improve the dispersibility of the particles in a solvent. One skilled in the art would not have used this document as there is no reference to the dispersion in a polymer. The surface treatment of WO 2008/074869 does not mention that the particles are coated with an amphiphilic agent after the treatment is applied. Likewise, in all examples, a solution is obtained so that there is no possibility that there is any coating.

US 2004/0166038 discloses coated luminescent particles. The coating agent is not an amphiphilic agent. There is no mention of the dispersion in a polymer.

U.S. Pat. No. 6,875,372 discloses phosphor powders. It is disclosed that phosphors can be coated. The coating agent can be a metal, a non-metallic compound or an organic compound like eg PMMA (polymethylmethacrylate), polystyrene or similar organic compounds, including surfactants that aid in the dispersion and/or suspension of the particles in a flowable medium.

WO 2015/044261 discloses phosphors in polymer but the particles of the phosphor are not modified by an amphiphilic agent.

None of these documents disclose a modified phosphor according to the invention.

SUMMARY OF INVENTION

A first object of the present invention is a modified phosphor comprising phosphor particles and at least one amphiphilic agent on the surface of the phosphor particles. The particles of the modified phosphor are coated with the at least one amphiphilic agent. The term "coated" means that the amphiphilic agent is on the surface of the phosphor particles.

According to an embodiment, all the particles of the modified phosphor comprise the amphiphilic agent on the surface. According to another embodiment, the modified phosphor comprise particles with no amphiphilic agent on the surface along with particles with the amphiphilic agent on the surface. The presence of the amphiphilic agent on the surface of a particle can be determined with the help of electron microscopy coupled with an analytic microscopy like XPS (X-ray photoelectron spectroscopy; using XPS it is possible to detect all elements except H and He).

The Amphiphilic Agent

The expression "amphiphilic agent" is used in the present specification to refer to a compound comprising at least one polar water-soluble group attached to a water-insoluble hydrocarbon chain. The function of the amphiphilic agent is to promote the dispersion of the particles of the modified phosphor in a polymer.

The amphiphilic agent is selected so that the particles of the modified phosphor are dispersible in a polymer. "Dispersible" means that the particles of the modified phosphor can be well dispersed in the polymer. This means that in the polymer, most of the particles do not form aggregates. This can be observed by electron microscopy (under eg a magnification of 5000). For instance, it has been observed that the particles of the modified phosphor MP1 (the amphiphilic agent is sodium stearate) can be well dispersed in an ethylene-vinyl acetate copolymer as is visible on FIG. 4. On FIG. 3, it can be observed that the particles of the unmodified phosphor are not well dispersed in the copolymer and that the particles form aggregates. The amphiphilic agent can thus be selected for a specific phosphor and for a specific polymer after extruding the polymer and the modified phosphor to form a film and by observing by electron microscopy if the particles of the modified phosphor are well dispersed in the film.

Non limiting examples of suitable amphiphilic agents are for instance linear or branched, aliphatic or aromatic, acids having from 10 to 50 carbon atoms, optionally carrying functional groups, such as aliphatic carboxylic acids, aliphatic sulphonic acids, aliphatic phosphonic acids, alkylarylsulphonic acids and alkylarylphosphonic acids, whether natural or synthetic, as well as their salts and derivatives.

The at least one amphiphilic agent can be selected from the group consisting of the linear or branched, aliphatic or aromatic, carboxylic acids having from 10 to 40 carbon atoms and their salts. Suitable, non-limiting examples include fatty acids and their salts of tall oil, soy oil, tallow oil, linseed oil, oleic acid, linoleic acid, stearic acid and its isomers, isostearic acid, pelargonic acid, capric acid, lauric acid, myristic acid, 4-hydroxy-benzoic acid, 2-ethylhexanoic acid, naphthenic acid, hexoic acid. The amphiphilic agent may be selected in the group of fatty acids or salts of a fatty acid. More particularly, the amphiphilic agent may be stearic acid or isostearic and their isomers. The amphiphilic agent may also be a salt of stearic acid or isostearic and their isomers. It may be sodium or magnesium stearate or isostearic acid.

The at least one amphiphilic agent may also be selected from the group consisting of the carboxylic acids containing ether linkages in the hydrocarbon chain, such as those of formula R—$(CH_2CO)_n$—COOH, with R being an alkyl radical having from 1 to 6 carbon atoms. An example of such a class of compounds is for instance $H_3CO$—$CH_2$—$(CH_2CO)$—$CH_2$—$(CH_2CO)$—$CH_2$—COOH.

The at least one amphiphilic agent may additionally comprise $CF_2$ units in the chain, e.g. partially fluorinated carboxylic acids of formula R—$(CF_2)_m$—COOH, wherein R is as defined above and m is comprised between 10 and 18.

Among suitable acids other than carboxylic acids, mention may be made of dodecylbenzenesulphonic acid, toluenesulphonic acid, toluenephosphonic acid, laurylsulphonic acid, laurylphosphonic acid, palmitylsulphonic acid and palmitylphosphonic acid.

Within the context of the present invention, the at least one amphiphilic agent can also be selected from polyoxyethylenated alkyl ether phosphates of formula (1):

or polyoxyethylenated dialkyl phosphates of formula (2):

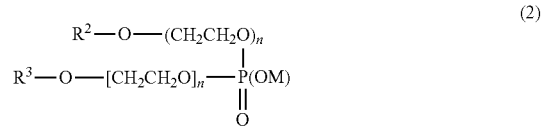

wherein:
in formula (1) $R_1$ is a linear or branched alkyl radical, in particular containing 2 to 20 carbon atoms, a phenyl radical, an alkylaryl radical, more particularly an alkylphenyl radical, in particular with an alkyl chain containing 8 to 12 carbon atoms, or an arylalkyl radical, more particularly a phenylaryl radical; n represents the number of ethylene oxide units, which can be from 0 to 12; and M represents hydrogen, sodium or potassium. Preferably, $R_1$ is a hexyl, octyl, decyl, dodecyl, oleyl or nonylphenyl radical;

in formula (2), $R_2$ and $R_3$, which may be the same or different, are selected from the linear or branched alkyl radicals, in particular containing 2 to 20 carbon atoms, the phenyl radicals, the alkylaryl radicals, more particularly an alkylphenyl radical, in particular with an alkyl chain containing 8 to 12 carbon atoms, or the arylalkyl radicals, more particularly a phenylaryl radical; n represents the number of ethylene oxide units, which can be from 0 to 12; and M represents hydrogen, sodium or potassium. Preferably, $R_2$ and $R_3$ are independently the one from the other a hexyl, octyl, decyl, dodecyl, oleyl or nonylphenyl radical.

Notable examples of amphiphilic agents of this type are: polyoxyethylene alkylether phosphates wherein the alkylether moiety has from 8 to 10 carbon atoms; polyoxyethylene tridecyl ether phosphate; polyoxyethylene oleodecyl ether phosphate; polyoxyethylene nonylphenyl ether phosphate; polyoxyethylene nonyl ether phosphate.

The at least one amphiphilic agent can be selected from the group consisting of the polyoxyethylenated alkyl ether carboxylates of formula (3): $R_4$—$(OC_2H_4)_p$—O—$R_5$, wherein $R_4$ is a linear or branched alkyl radical which can in particular contain 4 to 20 carbon atoms; p is an integer from 1 to 20, typically from 2 to 16, preferably from 3 to 12; and $R_5$ is a carboxylic acid residue, such as —$CH_2COOH$.

In an advantageous embodiment of the invention the at least one amphiphilic agent is selected from the group consisting of the linear or branched aliphatic carboxylic acids having from 10 to 40 carbon atoms, preferably having from 10 to 30 carbon atoms, more preferably having from 12 to 25 carbon atoms, and even more preferably having from 14 to 20 carbon atoms, and their salts.

In a particularly advantageous embodiment the at least one amphiphilic agent is selected from the group consisting of stearic acid, its isomers and their salts, e.g. alkaline metal salts. It may be stearic acid or isostearic and the isomers and salts thereof. It may be sodium or magnesium stearate or isostearic acid.

According to an embodiment, the amphiphilic agent is not a non-water-soluble polymer dispersant, in particular a non-water-soluble dispersant containing hydrophilic structural units and hydrophobic structural units obtained by polymerizing at least one vinyl compound.

The modified phosphor typically contains at least 0.1 wt % of the at least one amphiphilic agent with respect to the total weight of the phosphor particles, preferably at least 0.5 wt %, more preferably at least 0.7 wt % (that is for 100 parts of the modified phosphor particles, the amount of amphiphilic agent is 0.1 parts, preferably at least 0.5 parts, more preferably at least 0.7 parts). The amount of the at least one amphiphilic agent coated on the phosphor particles generally does not exceed 10.0 wt %, more typically it does not exceed 7.0 wt %, preferably it does not exceed 5.0 wt % with respect to the total weight of the phosphor particles.

The Phosphor

Any kind of inorganic phosphor may be used to prepare the modified phosphor of the invention. In particular inorganic phosphors suitable for the invention are those which contain at least one element selected from the group consisting of the rare earth elements, zinc and manganese.

Advantageously the phosphor is selected among those phosphors which contain at least one element selected from the group consisting of the rare earth elements, zinc and manganese and which have:
- an external quantum yield equal to or greater than 40% over at least an excitation wavelength comprised between 350 nm and 440 nm;
- an absorption equal to or less than 15% at a wavelength greater than 440 nm; and
- a maximum in the emission spectrum in a range of wavelengths comprised between 440 nm and 900 nm.

The phosphor typically has an external quantum yield of at least 40%, preferably of at least 50%, over at least an excitation wavelength comprised between 350 nm and 440 nm.

The phosphor absorbs well in the UV and little or not at all in the visible (440-700 nm). The phosphor has an absorption equal to or less than 15% at a wavelength greater than 440 nm, typically of less than 10%, preferably of less than 5%, and more preferably of less than 3%.

The maximum of the emission spectrum of the phosphor is in a range of wavelengths comprised between 440 nm and 900 nm, preferably comprised between 500 nm and 900 nm.

The optical properties of the modified phosphor are not modified by the presence of the at least one amphiphilic agent coated on the phosphor particles. Accordingly, the modified phosphor is characterised by the same external quantum yield, absorption and emission properties, and more generally by the same optical properties, as the phosphor.

The phosphor can be selected from the group consisting of the aluminates doped with at least one rare earth element and/or manganese. Suitable aluminates are those of formula (Ia) or (Ib):

$$A^1MgAl_{10}O_{17}:Eu^{2+} \quad (Ia)$$

$$A^1MgAl_{10}O_{17}:Eu^{2+},Mn^{2+} \quad (Ib)$$

wherein $A^1$ represents at least one of Ba, Sr, or Ca alone or in combination.

The expression "$A^1MgAl_{10}O_{17}:Eu^{2+}$", and its analogues throughout the text, is used in the present specification to denote an europium doped magnesium aluminate compound. Examples of representative aluminates are for instance $BaMgAl_{10}O_{17}:Eu^{2+}$ and $BaMgAl_{10}O_{17}:Eu^{2+}$, $Mn^{2+}$.

Alternative aluminates may be those of formula (II):

$$a(M_{1-d}M^1_dO).b(Mg_{1-e}M^2_eO).c(Al_2O_3) \quad (II)$$

wherein
M is at least one element selected from Ba, Sr and Ca;
$M^1$ denotes a rare earth, preferably at least one of Gd, Tb, Y, Yb, Eu, Nd or Dy, more preferably Eu;
$M^2$ denotes at least one of Zn, Mn or Co, preferably Mn; and wherein a, b, c, d and e satisfy the following relationships: $0.25 \leq a \leq 2.00$; $0 < b \leq 2.00$; $3.00 \leq c \leq 9.00$; $0 \leq d \leq 0.40$ and $0 \leq e \leq 0.60$.

Preferably the aluminates are selected from those of formula (IIa):

$$a(M_{1-d}Eu_dO).b(Mg_{1-e}Mn_eO).c(Al_2O_3) \quad (IIa)$$

wherein: M, a, b, c, d and e are as defined above; or (IIb):

$$a(Ba_{1-d}M^1_dO).b(Mg_{1-e}M^2_eO).c(Al_2O_3) \quad (IIb)$$

wherein: $M^1$ is as defined above, preferably Eu; $M^2$, a, b, c, d and e are as defined above.

More preferably, the phosphor is an aluminate selected from among those of formula (IIb). In particular, the phosphate may satisfy formula (IIb) above in which a=b=1.00 and c=5.00. Alternatively, the phosphor may satisfy formula (IIb) above in which a=b=1.00 and c=7.00. Still alternatively, the phosphor may satisfy formula (IIb) above in which a=1.00; b=2.00 and c=8.00. According to another embodiment, e=0. According to another embodiment, d=0.1. According to another embodiment, $0.09 \leq d \leq 0.11$. The aluminate may be the one from Example 1.

Notable examples that may be mentioned of suitable aluminates include those of formulae: $BaMgAl_{10}O_{17}$; $Ba_{0.9}Eu_{0.1}MgAl_{10}O_{17}$; $Ba_{0.9}Eu_{0.1}Mg_{0.6}Mn_{0.4}Al_{10}O_{17}$; $Ba_{0.9}Eu_{0.1}Mg_{0.8}Mn_{0.2}Al_{10}O_{17}$; $Ba_{0.9}Eu_{0.1}Mg_{0.95}Mn_{0.05}Al_{10}O_{17}$; $BaMgAl_{14}O_{23}$, $Ba_{0.9}Eu_{0.1}MgAl_{14}O_{23}$; $Ba_{0.8}Eu_{0.2}Mg_{1.93}Mn_{0.07}Al_{16}O_{27}$.

Aluminates as detailed above, having an average particle size $d_{50}$, determined by laser diffraction technique using a laser particle size analyzer (volume distribution), comprised between 80 nm and 300 nm, preferably between 80 and 200 nm and even more preferably between 100 and 200 nm can be prepared according to WO 2009/115435.

The constituent particles of the aluminate prepared according to the teaching of WO 2009/115435 is their single-crystal character. As a consequence of their single-crystal character, the aluminate particles of the invention are in a well-separated and individual form. There are no or few particle agglomerates. This good individualization of the particles may be demonstrated by comparing the $d_{50}$ measured by the laser diffraction technique and that measured from an image obtained by transmission electron microscopy (TEM). Use may be made of a transmission electron microscope that gives access to enlargements ranging up to 800 000. The principle of the method consists in examining, under the microscope, various regions (around 10) and in measuring the dimensions of 250 particles deposited on a support (for example after depositing a suspension of the particles on the support and having left the solvent to evaporate), while considering these particles to be spherical particles. A particle is judged to be identifiable when at least half of its perimeter can be defined. The TEM value corresponds to the diameter of the circle that correctly reproduces the circumference of the particle. The identification of the usable particles can be carried out by using ImageJ, Adobe Photoshop or Analysis software. After having measured the sizes of the particles by the above method, a cumulative particle size distribution of the particles is deduced therefrom, which is regrouped into several particle size categories ranging from 0 to 500 nm, the breadth of each category being 10 nm. The number of particles in each category is the basic data for representing the particle size distribution by number. The TEM value is the median diameter such that 50% of the particles (by number) counted on the TEM images have a diameter smaller than this value. Here too, the values obtained by these two techniques have a ($d_{50}$ value/TEM value) ratio that is in the same order of magnitude and therefore this ratio of less than 2, more particularly of at most 1.5.

The phosphor may also be selected from the group consisting of the europium-doped phosphates, for instance the phosphates of formula (III): $A^2BPO_4:Eu^{2+}$, wherein $A^2$ is selected from at least one of Li, Na, K, alone or in combination and B is selected from at least one of Ba, Sr, Ca alone or in combination. Non-limiting examples of phosphates of this kind are $LiCaPO_4:Eu^{2+}$ and $LiBaPO_4:Eu^{2+}$.

The phosphor may be selected from the group consisting of the rare earth phosphates of formula (IV): $La_xCe_yTb_zPO_4$, wherein x, y and z are such that the sum x+y+z is equal to 1 and at least one of y and z is different from 0.

If at least one of x and y is other than 0 in formula (IV), preferably z is at most 0.50; z may be between 0.05 and 0.20 and more particularly between 0.10 and 0.20. x may more particularly be between 0.40 and 0.95.

The following phosphates may be mentioned, as examples: $La_{0.44}Ce_{0.43}Tb_{0.13}PO_4$, $La_{0.57}Ce_{0.29}Tb_{0.14}PO_4$, $La_{0.56}Ce_{0.30}Tb_{0.14}PO_4$, $La_{0.94}Ce_{0.06}PO_4$, $Ce_{0.67}Tb_{0.33}PO_4$.

The phosphor may also be selected among the europium-doped halophosphates, such as those of formula (V): $A^3{}_5(PO_4)_3X:Eu^{2+}$, wherein $A^3$ represents at least one of Ba, Sr, Ca, alone or in combination, and X is OH, F or Cl. Examples of suitable halophosphates are $Sr_5(PO_4)_3Cl:Eu^{2+}$ and $Ca_5(PO_4)_3Cl:Eu^{2+}$.

Europium- and/or manganese-doped silicates can also be suitably used as the phosphor in the present invention.

These silicates may have the following general formulas (VIa) to (VIi):

$A^4MgSiO_4$ (VIa)

$A^4MgSiO_4:Eu^{2+}$ (VIb)

$A^4MgSiO_4:Eu^{2+},Mn^{2+}$ (VIc)

$A^4{}_3MgSi_2O_8$ (VId)

$A^4{}_3MgSi_2O_8:Eu^{2+}$ (VIe)

$A^4{}_3MgSi_2O_8:Eu^{2+},Mn^{2+}$ (VIf)

$A^4{}_2MgSi_2O_7$ (VIg)

$A^4{}_2MgSi_2O_7:Eu^{2+}$ (VIh)

$A^4{}_2MgSi_2O_7:Eu^{2+},Mn^{2+}$ (VIi)

wherein $A^4$ is selected from at least one of Ba, Sr, Ca. Examples of suitable silicates are provided in Table 1.

TABLE 1

| | absorption max (%) | emission (nm) |
|---|---|---|
| $Ba_3MgSi_2O_8: Eu^{2+}$ | 80 | 440 |
| $Ba_3MgSi_2O_8: Eu^{2+}, Mn^{2+}$ | 80 | 438-620 |
| $Ba_2MgSi_2O_7: Eu^{2+}$ | 100 | 505 |
| $BaMg_2Si_2O_7: Eu^{2+}, Mn^{2+}$ | 100 | 430-700 |

Among the silicates mention may be made of the compounds disclosed in WO 2004/044090. Suitable compounds are characterised by formula (VIj):

$Ba_{3(1-x)}Eu_{3x}Mg_{1-y}Mn_ySi_2O_8$ (VIj)

wherein x and y satisfy the following relationships: 0<x≤1.0; 0<y≤0.3 and x+y≤1.2. More particularly, x and y satisfy the following relationships: 0.0001≤x≤0.25 and 0.0001≤y≤0.25; or 0.01≤x≤0.25 and 0.01≤y≤0.25.

Cerium-doped rare earths borates or silicates may also be used as phosphors of the invention.

Suitable borates typically comply with general formula (VII): $LnBO_3:Ce^{3+}$ or $LnBO_3:Ce^{3+},Tb^{3+}$ or $LnBO_3:Eu^{3+}$, wherein Ln is at least one of La, Gd, Y, Lu, such as $YBO_3:Eu^{3+}$.

Suitable silicates typically comply with general formula (VIII): $Ln_2SiO_5: Ce^{3+}$, wherein Ln is at least one of La, Gd, Y, Lu.

Additionally, suitable phosphors may be selected among the rare earth oxysulphurs of formula (IX): $Ln_2O_2S:Eu^{3+}$, wherein Ln represents La, Gd, Y, Lu. A notable example of such a phosphor is $La_2O_2S:Eu^{3+}$.

Rare earths vanadates of formulas (Xa) or (Xb) may also be used as phosphors in the present invention: $LnVO_4:Eu^{3+},Bi^{3+}$ (Xa), $Ln'PVO_4$ (Xb), wherein Ln is at least one of La, Gd, Y, Lu and Ln' is at least one rare earth element. A suitable example of such phosphor is for instance $YVO_4:Eu^{3+},Bi^{3+}$.

Additional suitable phosphors may be selected from the group consisting of the zinc compounds doped with maganese, zinc, silver and/or copper. Notable examples are: $ZnS:Mn^{2+}$, ZnS:Ag,Cu and ZnO:Zn.

The phosphors as detailed above can be prepared according to known procedures. All preferences of the chemical nature detailed above for the phosphor equally apply to the modified phosphor of the invention.

The phosphor of the invention is in the form of particles. The phosphor is characterized by a specific size and size distribution. The particles of phosphor are typically characterised by a mean diameter $d_{50}$ of less than 1.00 μm. The mean particle diameter $d_{50}$ is typically of at most 0.80 μm, preferably of at most 0.60 μm more preferably of at most 0.50 μm. The mean diameter $d_{50}$ may in some instances be of at most 0.50 μm. The mean particle diameter $d_{50}$ is typically of at least 0.01 μm, preferably of at least 0.05 μm, more preferably of at least 0.10 μm, even more particularly of at least 0.20 μm.

Typically, the phosphor particles have a narrow particle size distribution, more precisely their distribution index may be at most 1.0, preferably at most 0.7 and even more preferably at most 0.5.

The phosphor may exhibit a mean particle diameter $d_{50}$ of less than 1.00 μm and typically of at least 0.01 μm; more particularly, of less than 0.80 μm and at least 0.20 μm.

It is important to control the size and distribution of the modified phosphor to promote a good dispersion in the polymer and to reduce the haze of the film. The characteristics of the size and size distribution of the phosphor equally apply to the modified phosphor. Measurement of such characteristics is performed by laser diffraction technique (volume distribution) in the appropriate solvent (see definitions). For instance, in the case of modified phosphor MP1, a suitable solvent wherein the particles do not settle and remain in suspension can be an isoparaffinic solvent like Isopar®.

In an advantageous embodiment of the invention the modified phosphor is characterised by:
- a mean particle diameter $d_{50}$ of less than 1.00 µm and typically of at least 0.01 µm; more particularly, of less than 0.80 µm and at least 0.20 µm;
- an external quantum yield equal to or greater than 40% over at least an excitation wavelength comprised between 350 nm and 440 nm;
- an absorption equal to or less than 15% at a wavelength greater than 440 nm; and
- a maximum in the emission spectrum in a range of wavelengths comprised between 440 nm and 900 nm.

The modified phosphor is typically in the form of a solid particulate, the particles having the size and size distribution as defined above. Liquid compositions comprising the modified phosphor and a liquid medium may be obtained by dispersing the modified phosphor in a suitable liquid.

The Preparation of the Modified Phosphor

The modified phosphor of the invention may typically be prepared according to any suitable method for the coating of inorganic particles. A method usable is the one disclosed in example 1 ("preparation of a modified phosphor MP1").

According to a first embodiment of the invention the modified phosphor may be prepared according to a process wherein the at least one amphiphilic agent is added to the dry particles of the phosphor. The mixing equipment available for mixing the dry particles of the phosphor and a liquid containing the amphiphilic agent is known by a person skilled in the art. When the at least one amphiphilic agent is a liquid, the addition can be carried out using the pure amphiphilic agent or a liquid composition comprising the amphiphilic agent and a suitable solvent. When the amphiphilic agent is a solid it is preferred to dissolve the solid in a suitable solvent before carrying out the addition to the phosphor particles. The solvent will typically be selected among solvents capable to dissolve the amphiphilic agent and which can be easily removed from the final product at the end of the coating process and which do not dissolve the phosphor particles. When the amphiphilic agent is a solid, it is also possible to use a dispersion of fine particles of the amphiphilic agent in a solvent that can be easily removed from the final product at the end of the coating process and which do not dissolve the phosphor particles.

According to another embodiment of the invention, the modified phosphor may be prepared according to a process comprising the steps of: providing a composition of phosphor particles in a liquid medium; adding at least one amphiphilic agent to said composition; and removing the liquid medium and drying. Mixing can be performed by using a cross blade impeller.

The liquid medium is typically selected on the basis of the nature of the phosphor particles and of the at least one amphiphilic agent using competences well known to the person skilled in the art.

In an advantageous embodiment of the process the at least one amphiphilic agent is added to a composition of phosphor particles in a liquid medium during a wet milling step carried out to provide the desired particle size of the phosphor. The wet milling step is generally carried out in water or else in a water/solvent mixture or in an organic solvent. The wet milling step is carried out under conditions which are well known to those skilled in the art.

The at least one amphiphilic agent is added to the phosphor during the wet milling step, by adding a suitable amount of the at least one amphiphilic agent to the phosphor being ground. The at least one amphiphilic agent may be added as such, either in solid (e.g. with sodium stearate) or liquid form (e.g. isostearic acid), or as a solution in a suitable solvent as defined above. The selection of the solvent for the wet milling step will be thus carried out taking into account the compatibility of said solvent with both the phosphor and the at least one amphiphilic agent.

The amphiphilic agent may be added gradually to ensure that the particles of phosphor are all coated by the amphiphilic agent.

At the end of the step of mixing the phosphor and the amphiphilic agent, the mixture can be dried to remove any trace of solvent or water that may have been used. The duration and temperature for removing the traces of solvent or water depend on the type of solvent used and also on the type of amphiphilic agent used.

The Composition Comprising the Modified Phosphor and a Polymer

It has been found that the modified phosphor of the invention can be incorporated into a polymer to advantageously provide articles having luminescent properties and better transparency than prior art articles. A better transparency is attained through a good dispersion of the particles of the modified phosphor in the polymer.

Accordingly, a further object of the invention is a composition comprising the modified phosphor of the invention and a polymer. The invention thus also relates to a composition comprising particles of a phosphor on the surface of which at least one amphiphilic agent is present, dispersed in at least one polymer. The phosphor is as disclosed above, in all embodiments and variations disclosed. The amphiphilic agent is as disclosed above, in all embodiments and variations disclosed.

The nature of the polymer in the composition is not particularly limited. According to an embodiment, the polymer (or the mixture of polymers) is adapted to be extruded in the form of a film.

The polymer (Pol1) may be selected from the group consisting of the alpha-olefin homo- and copolymers, the polycondensation polymers such as polyamides, polyesters, polycarbonates, polyacrylates, and the halogenated polymers, such as the chlorinated and the fluorinated polymers.

Among the alpha-olefin homo- and copolymers mention may be made of ethylene homopolymers, propylene homopolymers, ethylene/propylene copolymers, ethylene/1-butene copolymers, ethylene/1-hexene copolymers, ethylene/1-octene copolymers, propylene/1-octene copolymers, ethylene/vinyl acetate copolymers, ethylene/(meth)acrylic acid copolymers, neutralised ethylene/(meth)acrylic acid copolymers.

Suitable alpha-olefin homo- and copolymers may be functionalized for instance by grafting of the unfunctionalized polymer with one or more ethylenically unsaturated monomers bearing at least one functional group. Suitable grafting agents are for instance: acrylonitrile, methacrylonitrile, methylvinyl ketone, unsaturated dicarboxylic acids, esters thereof, and anhydrides thereof, e.g. maleic anhydride; acrylic and/or methacrylic acid, and esters thereof.

Among suitable polyesters mention may be made of those polyesters comprising recurring units deriving from ethylene glycol and phthalic acids, e.g. terephthalic acid or isophthalic acid.

Among the halogenated polymers mention may be made of the fluorinated polymers, in particular of the polymers comprising recurring units deriving from at least one ethylenically unsaturated fluorinated monomer. Non-limiting examples of suitable ethylenically unsaturated fluorinated monomers are:

$C_2$-$C_8$ fluorofluoroolefins, such as tetrafluoroethylene, hexafluoropropylene, pentafluoropropylene, and hexafluoroisobutylene;

$C_2$-$C_8$ hydrogenated fluoroolefins, such as vinyl fluoride, 1,2-difluoroethylene, vinylidene fluoride and trifluoroethylene;

fluoroalkylethylenes of formula $CH_2=CH-R_{f0}$, wherein $R_{f0}$ is a $C_1$-$C_6$ fluoroalkyl or a $C_1$-$C_6$ fluorooxyalkyl having one or more ether groups;

chloro- and/or bromo- and/or iodo-$C_2$-$C_6$ fluoroolefins, like chlorotrifluoroethylene;

fluoroalkylvinylethers of formula $CF_2=CFOR_{f1}$ in which $R_{f1}$ is a $C_1$-$C_6$ fluoroalkyl, e.g. $-CF_3$, $-C_2F_5$, $-C_3F_7$.

Notable examples of suitable fluorinated polymers are the polymers of vinylidene fluoride, the ethylene/chlorotrifluoroethylene copolymers as well as the ethylene/tetrafluoroethylene copolymers.

Among the alpha-olefin copolymers, mention may be made of copolymers comprising copolymerized units of ethylene and of at least one carboxylic acid vinyl ester. As examples of carboxylic acid vinyl esters, mention may be made of vinyl acetate, vinyl versatate, vinyl propionate, vinyl butyrate or vinyl maleate. Vinyl acetate is preferred. The copolymers may comprise units of ethylene and vinyl acetate only. The copolymers may comprise as monomers, from 5 to 40 wt % of the carboxylic acid vinyl ester and from 60 to 95 wt % of ethylene. More particularly, the copolymers may comprise as monomers, from 10 to 35 wt % of the carboxylic acid vinyl ester and from 65 to 90 wt % of ethylene. Most preferred for a good balance of optical and mechanical properties, the copolymers may comprise as monomers, from 25 to 35 wt % of the carboxylic acid vinyl ester and from 65 to 75 wt % of ethylene.

The copolymer may have a melt flow rate (MFR) in the range of from 0.1 to 300 g/10 min (ASTM D 1238 at 190° C./2.16 kg), yet more particularly from 0.5 to 50 g/10 min. An example of EVA copolymer can be the EVA of example 2 or an EVA with 33 wt % of vinyl acetate and an MFR of 45 g/10 min.

When the composition is based on a copolymer of ethylene and of at least one carboxylic acid vinyl ester, it may also further comprise at least one organic peroxide as crosslinking agent which enables to crosslink the copolymer. When the composition is in the form of a film, the crosslinking makes it possible to increase the adhesion strength, humidity resistance and penetration resistance of the film, while maintaining a high transparency. The term "polymer" thus also encompasses "a crosslinked polymer".

The organic peroxide preferably decomposes at a temperature of at least 110° C. The peroxide and the amount of peroxide are chosen such that the conditions of processing of the copolymer are not significantly altered. For instance, when the copolymer is extruded, the peroxide and the amount of peroxide are chosen such that the conditions of extrusion (temperatures of the zones, nature of the extruder, rotating speed, . . . ) are not changed significantly in comparison to the conditions for extrusion used for the copolymer without the crosslinking agent. Examples of organic peroxides include 2,5-dimethylhexan-2,5-dihydroperoxide, 2,5-dimethyl-2,5-di-tert-butylperoxy)hexane, 3-ditert-butylperoxide, dicumylperoxide, 2,5-dimethyl-2,5-di(2-ethylhexanoylperoxy)hexane, 2,5-dimethyl-2,5-di(tertbutylperoxy)hexane, tert-butylcumylproxide, (alpha), (alpha)'-bis(tert-butylperoxyisopropyl)benzene, (alpha), (alpha)'bistertbutylperoxy)diisopropylbenzene, n-butyl-4,4-bis(tert-butylperoxy)butane, 2,2-bis-tert-butylperoxy) butane, 1,1-bis(tert-butylperoxy)cyclohexane, 1,1-bis (tertbutylperoxy)-3,3,5-trimethylcyclohexane, tert-butylperoxybenzoate, benzoylperoxide and 1,1-di(tert-hexylperoxy)-3,3,5-trimethylcyclohexane. 2,5-dimethyl-2, 5-di(2-ethylhexanoylperoxy)hexane and 1,1-di(tert-hexylperoxy)-3,3,5-trimethylcyclohexane can be more particularly mentioned. Tert-butylperoxy2-ethylhexyl carbonate or 2,5-di-methyl-2,5-di(tert-butylperoxy)hexane can also be mentioned because these peroxides enable high crosslinking of EVA.

The content of the organic peroxide in the composition may be in the range of 0.1 to 5 parts by weight, more particularly of 0.2 to 1.8 parts by weight based on 100 parts by weight of the copolymer. The composition may further contain at least one crosslinking auxiliary agent which provides at least one polymerizable functional groups. The content of the crosslinking auxiliary agent typically is in the range of 0.1 to 5.0 parts by weight based on 100 parts by weight of copolymer. Examples of auxiliary agents comprise tri-functional crosslinking agents such as triallyl cyanurate and triallyl isocyanurate and mono- and di-functional crosslinking auxiliary agents of (meth)acrylic esters. Among these compounds, triallyl cyanurate and triallyl isocyanurate are preferred.

The person skilled in the art knows how to adapt the nature and content of the organic peroxide(s) and crosslinking auxiliary agent(s) to the copolymer. Mention may be made in particular of the following documents Solar Energy Materials & Solar Cells 2013, 116, 203-218 and WO 2013/171272. In particular, the person skilled in the art will select the organic peroxide(s) so that the half-life temperature of the peroxide(s) is/are adapted to the temperature at which the extrusion is conducted. The temperature of extrusion depends to a large extent to the nature of the polymer to be extruded. The contents of said organic peroxide(s) is also chosen so that the extrusion is still possible and so that the final film which is extruded maintains the right balance of mechanical and optical properties.

The composition may also further comprise other additives known in the art of modification of a copolymer for photovoltaic modules. For instance, the composition can also comprise at least one silane coupling agent to improve the adhesive strength of the composition.

The composition contains typically at least 0.05 wt %, preferably at least 0.10 wt %, more preferably at least 0.20 wt % of the modified phosphor based on the total weight of the composition. The amount of the modified phosphor typically is at most 10.00 wt %, preferably at most 7.00 wt %, more preferably at most 5.00 wt % based on the total weight of the composition. Good results were obtained when the modified phosphor is present in an amount of 0.10 to 5.00 wt %, based on the total weight of the composition, preferably of 0.20 to 2.00 wt %, based on the total weight of the composition. The amount of modified phosphor in the composition is determined in such a way that a film made with the composition exhibits the desired luminescent properties and a good transparency.

According to a specific embodiment, the composition comprises a modified phosphor and at least one polymer wherein:

the phosphor is an aluminate as described above;

the at least amphiphilic agent is stearic acid or isostearic and their isomers and salts thereof;

the polymer is a copolymer comprising copolymerized units of ethylene and of at least one carboxylic acid vinyl ester as described above.

The copolymer may be crosslinked or not. The copolymer may comprise units of ethylene and vinyl acetate only.

The composition may be prepared using any conventional technique known in the art. As an example, mixing can be carried out by means of any mixing apparatus known to be useful for preparing polymer compositions, including a roller-type rubber mill, a Banbury mixer, a twin-screw extruder and the like. Mixing may be made according to the technique disclosed in the examples for the preparation of MP1.

In an embodiment, the polymer (Pol1) is mixed with the phosphor for the preparation of the composition.

In another embodiment, the polymer (Pol1) previously described is mixed with a masterbach comprising the phosphor for the preparation of the composition. In this case, the polymer (Pol1) is mixed with a masterbach comprising the phosphor predispersed into a polymer (Pol2). Polymer (Pol2) may be of the same type as polymer (Pol1) or it may also be different. The two polymers (Pol1) and (Pol2) are preferably compatible so as to form an homogeneous mixture. For instance, when (Pol1) is an ethylene-vinyl acetate copolymer, Pol2 may be the same ethylene-vinyl acetate copolymer or a different one or Pol2 may also be a compatible polymer, like for instance a polyethylene. The masterbatch is prepared by the same conventional technique described above, for instance it can be prepared with an extruder. The interest of using a masterbatch is that the particles can be well predispersed using a mixing equipment exhibiting high shear rates. The various additives (e.g. crosslinking agent(s), auxiliary agent(s) described above) may be present in Pol1 or in Pol2 or may be added separately.

The invention also relates to a process for preparing a composite according to the invention, wherein a polymer Pol1 and the modified phosphor, or else the polymer Pol1 and a masterbatch comprising the phosphor pre-dispersed in a polymer Pol2, are extruded.

The Article Made of the Composition

A further object of the invention is an article comprising the composition of the invention.

In an embodiment of the invention the article is in the form of a film or a sheet. The film or sheet may have a thickness of from 15 to 800 μm, preferably from 20 to 600 μm, and more preferably from 25 to 500 μm. The thickness may be determined with a micrometer. The thickness is measured at 25° C. and is the arithmetic mean thickness of 20 random measures made on the film.

Techniques for manufacturing films are well known in the art. The composition of the invention will be preferably processed under the form of a film by cast extrusion or hot blown extrusion techniques, optionally with mono- or bi-axial orientation. A technique particularly adapted to the manufacture of films of the composition of the invention involves extruding the molten composition through a die having elongated shape so as to obtain an extruded tape and casting/calendering said extruded tape so as to obtain a film. The tape can be calendered into a film by passing through appropriate rolls, which can be maintained at appropriate temperatures, and whose speed can be adjusted so as to achieve the required thickness. The thickness of the film is adjusted at the die.

Films obtained from the composition of the invention are preferably transparent films, i.e. films having a total transmittance of more than 80%, preferably more than 90% when determined on films having a thickness of about 450 μm according to the method detailed below.

Additionally, films obtained from the composition of the invention are preferably such that in transmission, the scattering of light responsible for the reduction of contrast of images viewed through them is limited. In other words, films obtained from the composition of the invention have haze values (as below defined) of less than 35%, preferably of less than 30%, when determined on films having a thickness of about 450 μm.

Films so obtained are another object of the present invention.

The film of the invention can be advantageously assembled in a multilayer structure. Multilayer structures comprising the film of the invention are still objects of the present invention.

The Use of the Film

The films of the invention are particularly suitable for being used in photovoltaic modules of green-houses. The photovoltaic module includes solar cells made of crystalline silicon. Solar cells may be of second-generation solar cells known as "thin-film" solar cells, which are, for example, cells based on amorphous silicon, cadmium telluride (CdTe) or copper indium gallium selinide (CIGS) and homologues thereof, or third-generation cells such as organic photovoltaic (OPV) systems, and dye-sensitized solar cells (DSSC).

Another aspect of the invention is a photovoltaic module comprising the composition of the invention in the form of a film or layer. The film or layer makes it possible to increase the absolute light energy to electrical energy conversion efficiency of the active elements of the solar cell, once affixed. It makes it possible to convert the UV rays into visible radiation absorbed by the active elements, which increases the number of solar photons that can be used.

The composition in the form of a film or layer may be positioned on the front face of the active elements of the cell, for example directly as an encapsulant of these elements or in place of the glass of the cell or as a layer deposited on this glass. An active element of the cell is an element that converts light energy into electricity.

The invention therefore also relates to the use of a composition in the form of a film or layer for increasing the light energy to electrical energy conversion efficiency of a photovoltaic cell.

The invention also relates to a process for converting light energy into electrical energy using a photovoltaic cell that consists in increasing, with the aid of the composition in the form of a film or layer, the number of solar photons that can be used by the active elements for the conversion of light energy into electricity.

The invention will be now described in more detail with reference to the following examples, whose purpose is merely illustrative. Should the disclosure of any patents, patent applications, and publications which are incorporated herein by reference conflict with the description of the present application to the extent that it may render a term unclear, the present description shall take precedence.

EXAMPLES

Example 1: Preparation of a Modified Phosphor MP1

A suspension in water of $Ba_{0.9}Eu_{0.1}MgAl_{10}O_{17}$ was prepared following the Example 1 of WO 2009/115435 A1 without adding any dispersant at the wet grinding step. The grinding step was performed with a pilot wet grinder Labstar (NETSZCH®) with the following parameters:

TABLE 2

| concentration in water of $Ba_{0.9}Eu_{0.1}MgAl_{10}O_{17}$ (wt %) | 12 |
|---|---|
| grinding media size (mm) | $ZrO_2$—$Y_2O_3$ (0.4-0.6) |

After 150 min of grinding, the average particle diameter of the phosphor was found to be $d_{50}$=290 nm (measured as a diluted dispersion in water). It was measured using a Malvern Nanosizer.

6 g of sodium stearate was added to the suspension (6 g of stearate and 234 g of phosphor $Ba_{0.9}Eu_{0.1}MgAl_{10}O_{17}$ represent 2.5 wt % of sodium stearate) under stirring with a four cross blade impeller during one hour. After mixing, the said suspension was then dried in an oven at 100° C. for one night providing a modified phosphor MP1. The absorption and emission spectra of the modified phosphor MP1 are reported in FIGS. 1 and 2.

A reference phosphor sample (P1) was prepared following the same procedure without the addition of any amphiphilic agent during the wet grinding step.

Example 2: Preparation of a Composition with MP1 and with P1

A polymeric composition comprising 90 wt % of an ethylene/vinyl acetate copolymer (Elvax® 150 commercially available from DuPont containing 32 wt % vinyl acetate; melt flow rate at 190° C./2.16 kg of 43 g/10 min) and 10 wt % of the modified phosphor MP1 was prepared using a co-rotating twin-screw extruder type Prism 25D (diameter 16 mm and L/D ratio of 25; screw profile: PR25.5).

Pellets of the ethylene/vinyl acetate copolymer and MP1 were premixed in a rotary mixer for 10 min, and then introduced into the extruder under the following operating conditions: Table 3. A masterbatch MB1 was thus obtained in the form of pellets.

TABLE 3

| Raw material flow rate (kg/h) | 1.8 |
|---|---|
| Screw rotation speed (rpm) | 250 |
| Temperature (° C.) | 90 |

A similar composition (comparative MB1) was prepared using the reference phosphor P1 (unmodified).

Example 3: Film Preparation 402 g of the previously obtained masterbatches were mixed with 7650 g of pure Elvax® 150 (representing in the final composition a phosphor loading of 0.5 wt %) during 10 minutes in a rotative blender then extruded using a co-rotating twin-screw extruder Leistritz LMM 30/34 type (34 mm diameter and L/D ratio of 25, screw profile: L16 without degassing) equipped with a slot die (300 mm in width and 450 to 500 microns thick). Table 4 reports the extrusion parameters.

TABLE 4

| Raw material flow (kg/h) | 3 |
|---|---|
| Screw rotation speed (rpm) | 200 |
| Extrusion temperature (° C.) | 90 |
| Chill roll Temperature (° C.) | 10 |
| Film output speed (m/min) | 0.5 |
| Film tension (N) | 6 |

The films obtained had a thickness of 450 μm.

Their optical properties were measured using a UV-VIS spectrometer Lambda 900 Perkin Elmer. Total transmission was measured over a range from 450 to 800 nm and normalized between 0 and 100%.

Haze was determined on the same instrument according to the following procedure: total transmittance was recorded between 450 and 800 nm (step 1 nm). Diffuse transmittance was recorded between 450 and 800 nm (step 1 nm). [haze at 524 nm was determined according to the following relationship:

% $haze_{524\ nm}$=total transmittance (%)$_{524\ nm}$/diffuse transmittance$_{524\ nm}$]

The photoluminescence yield under UV 370 nm excitation of the inventive film and of the comparative film were determined using a HORIBA JOBIN YVON fluoromax 3 luminescence spectrometer equipped with a film device oriented at 30°. The film sample was fixed on the film device and luminescence spectrum was recorded between 390 nm and 650 nm under 370 nm excitation wavelength.

The value measured for the inventive film was set as 100% photoluminescence yield.

TABLE 5

|  | inventive film (0.5 wt % of MP1) | comparative film (0.5 wt % of P1) |
|---|---|---|
| total transmission (%) 450-800 nm | 92.6 | 86.5 |
| haze (% at 524 nm) | 25.8 | 47.0 |
| PL (%) vs inventive film | 100.0 | 21.5 |

The data in Table 5 show that the modified phosphor of the invention provides articles provided of lower haze and higher light transmittance than the films obtained with phosphors of the prior art. FIGS. 3 and 4 make it possible to compare the dispersion of the particles in the same polymer of respectively the unmodified and modified phosphor.

The films also have a higher photoluminescence yield with respect to films obtained using the same phosphor with no amphiphilic agent on the surface.

Example 4: Preparation of Photovoltaic Modules p-type cells mono- or polycristalline silicium were tested: Solland Solar cell (efficiency of the bare cell 16%) or Photowatt cell (efficiency of the bare cell 20%).

A module is prepared in the following way:
- the electrical connection Ag capped Cu is applied on the semiconductor;
- the stack is prepared by successively adding the backsheet (PVDF based), back encapsulant (EVA type) and semi-conductor with its contacts;
- the film of the invention (width 30 cm; thickness 500 μm) as front encapsulant is then added;
- glass as a frontsheet is added.

Once prepared, the stack is processed through a hot-press lamination process (120° C./30 min) to trigger the cross-linking and make it possible to strongly attach the layers Efficiency of the modules Measures of EQE (external quantum efficiency) are performed on an Oriel system IQE-200 on all bare cells and on all modules between 300-1200 nm. The relative ratio measured is: $(EQE_{bare\ cells} - EQE_{module})/EQE_{bare\ cells}$. This ratio is multiplied by the absolute efficiency of the bare cell. This operation is done on three points on each cell. The mean value (%) corresponds to the mean value of the measured of the module efficiency.

In Table 6, the properties of films according to the invention composed of EVA with various loadings of MP1 are given. The same properties are given for a film composed of Elvax 150 with no phosphor and no crosslinking and for a film composed of another EVA (STR 15420 which is a photovoltaic encapsulating film material made of EVA with improved curing kinetics and photo-thermal stability commercialized by STR, Inc).

TABLE 6

| films applied for Photowatt 20% | haze of the film (%) | TT of the film (%) | mean value of the module efficiency (%) |
|---|---|---|---|
| film made of Elvax ® 150 (with no phosphor and no crosslinking) | 4 | 93 | 19.1 |
| film made of EVA STR 15420 | 7 | 93 | 17.8 |
| film according to the invention with 0.5% wt of MP1 in Elvax ® 150 | 22 | 90 | 18.4 |
| film according to the invention with 0.75% wt of MP1 in Elvax ® 150 | 31 | 90 | 18.0 |
| film according to the invention 1% wt of MP1 in Elvax ® 150 | 41 | 89 | / |

TT: total transmission
modified phosphor MP1: EQ = 52%, $d_{50}$ = 290 nm

As can be seen, the efficiency of a film according to the invention at a loading of 0.5 wt % of MP1 is higher (18.4%) than for a film made of STR 15420 (17.8%).

It can also be seen that the total transmission of the film is not affected much when the loading of MP1 increases from 0.5 to 1 wt %, which can be linked to the good dispersion of the modified phosphor.

In Table 7, the properties of films according to the invention composed of EVA with various loadings of MP1 are given. The same properties are given for a film composed of Elvax 150 with no phosphor and no crosslinking and for a film composed of another EVA (STR 15505 which is a photovoltaic encapsulating film material made of EVA with improved curing kinetics and photo-thermal stability commercialized by STR, Inc).

TABLE 7

| films applied for Solland 16% | haze of the film (%) | TT of the film (%) | mean value of the module efficiency (%) |
|---|---|---|---|
| film made of Elvax ® 150 (with no phosphor and no crosslinking) | 4 | 93 | 15.8 |
| film made of EVA STR 15505 | / | / | 15.3 |
| film according to the invention with 0.5% wt of MP1 in Elvax ® 150 | 22 | 90 | 15.8 |
| film according to the invention with 0.75% wt of MP1 in Elvax ® 150 | 31 | 90 | 15.7 |
| film according to the invention 1% wt of MP1 in Elvax ® 150 | 41 | 89 | / |

TT: total transmission
modified phosphor MP1: EQ = 52%, $d_{50}$ = 290 nm

Similar conclusions can be drawn here with results in Table 7.

Based on these results, it appear that films of the invention with a thickness of 450 nm preferably exhibit a haze at 524 nm less than 35%, preferably of less than 30%, the haze being determined according to the following relationship:

% haze$_{524\ nm}$=total transmittance (%)$_{524\ nm}$/diffuse transmittance$_{524\ nm}$, the total transmittance and diffuse transmittance being recorded with a UV-VIS spectrometer over a range from 450 to 800 nm with a step of 1 nm.

Films of the invention with a thickness of 450 nm also preferably exhibit a total transmittance in the range 450-800 nm of more than 80%, preferably more than 90%, the total transmittance being recorded with a UV-VIS spectrometer over a range from 450 to 800 nm with a step of 1 nm.

The invention claimed:

1. A film consisting of a composition comprising a modified phosphor and at least one polymer, said modified phosphor comprising phosphor particles and at least one amphiphilic agent coated thereon, wherein the phosphor comprises a silicate having the formula (Vij):

Ba$_{3(1-x)}$Eu$_{3x}$Mg$_{1-y}$Mn$_y$Si$_2$O$_8$ (Vij)

wherein x and y satisfy the relationships 0<x≤1.0; 0<y≤0.3 and x+y≤1.2, said modified phosphor having:

an external quantum yield equal to or greater than 40% over an excitation wavelength between 350 nm and 440 nm, an absorption equal to or less than 15% at a wavelength greater than 440 nm, and a maximum in the emission spectrum in a range of wavelengths between 440 nm and 900 nm, said composition, when in the form of a second film having a thickness of about 450 μm, exhibiting:

a haze at 524 nm of less than 35%, the haze being determined according to the relationship:

% haze$_{524\ nm}$=total transmittance (%)$_{524\ nm}$/diffuse transmittance$_{524\ nm}$, and a total transmittance in the range 450-800 nm of more than 80%, the total transmittance being recorded with UV-VIS spectrometer over a range from 450 to 800 nm with a step of 1 nm.

2. The film of claim 1, wherein the phosphor further comprises an europium-and/or manganese-doped silicate having one of the general formulas (VIa) to (VIi):

A$^4$MgSiO$_4$ (VIa)

A$^4$MgSiO$_4$:Eu$^{2+}$ (VIb)

A$^4$MgSiO$_4$:Eu$^{2+}$,Mn$^{2+}$ (VIc)

A$^4_3$MgSi$_2$O$_8$ (VId)

A$^4_3$MgSi$_2$O$_8$:Eu$^{2+}$ (VIe)

A$^4_3$MgSi$_2$O$_8$:Eu$^{2+}$,Mn$^{2+}$ (VIf)

A$^4_2$MgSi$_2$O$_7$ (VIg)

A$^4_2$MgSi$_2$O$_7$:Eu$^{2+}$ (VIh)

A$^4_2$MgSi$_2$O$_7$:Eu$^{2+}$,Mn$^{2+}$ (VIi)

wherein A$^4$ is selected from at least one of Ba, Sr, Ca.

3. The film of claim 1, wherein the phosphor further comprises a silicate having one of the following formulas: Ba$_3$MgSi$_2$O$_8$:Eu$^{2+}$, Ba$_3$MgSi$_2$O$_8$:Eu$^{2+}$, Mn$^{2+}$, Ba$_2$MgSi$_2$O$_7$:Eu$^{2+}$, BaMg$_2$Si$_2$O$_7$:Eu$^{2+}$,Mn$^{2+}$.

4. The film of claim 1, wherein the phosphor further comprises an aluminate corresponding to one of formulae BaMgAl$_{10}$O$_{17}$; Ba$_{0.9}$Eu$_{0.1}$MgAl$_{10}$O$_{17}$; Ba$_{0.9}$Eu$_{0.1}$Mg$_{0.6}$Mn$_{0.4}$Al$_{10}$O$_{17}$; Ba$_{0.9}$Eu$_{0.1}$Mg$_{0.8}$Mn$_{0.2}$Al$_{10}$O$_{17}$; Ba$_{0.9}$Eu$_{0.1}$Mg$_{0.95}$Mn$_{0.05}$Al$_{10}$O$_{17}$; BaMgAl$_{14}$O$_{23}$; Ba$_{0.9}$Eu$_{0.1}$MgAl$_{14}$O$_{23}$; Ba$_{0.8}$Eu$_{0.2}$Mg$_{1.93}$Mn$_{0.07}$Al$_{16}$O$_{27}$.

5. The film of claim 1 wherein the phosphor consists of a silicate having the formula (Vij).

6. The film of claim 1 wherein the particles of the modified phosphor are dispersed in the polymer.

7. The film of claim 1 wherein the particles of the modified phosphor have a mean diameter d$_{50}$ of at least 0.10 μm and of at most 1.00 μm.

8. The film of claim 1 wherein the at least one amphiphilic agent is selected from the group consisting of the linear or branched, aliphatic or aromatic, acids having from 10 to 50 carbon atoms, optionally carrying functional groups, as well as their salts and derivatives.

9. The film of claim 1 wherein the amphiphilic agent is selected from the group consisting of the linear or branched aliphatic carboxylic acids having from 10 to 40 carbon atoms and their salts.

10. The film of claim 1 wherein the amphiphilic agent is selected from the group consisting of stearic acid, isostearic and their isomers and salts thereof.

11. The film of claim 1 wherein the at least one amphiphilic agent is least 0.1 wt % and at most 10.0 wt % with respect to the total weight of the phosphor particles.

12. The film of claim 1 wherein the modified phosphor is prepared by a process comprising the steps of providing a composition of phosphor particles in a liquid medium; adding at least one amphiphilic agent to said composition; and removing the liquid medium.

13. The film of claim 1, wherein the polymer is selected from the group consisting of alpha-olefin homo-and copolymers, polycondensation polymers, polyesters, polycarbonates, polyacrylates, and halogenated polymers.

14. The film of claim 1, wherein the polymer is a copolymer comprising copolymerized units of ethylene and of at least one carboxylic acid vinyl ester.

15. The film of claim 14, wherein the copolymer is crosslinked.

16. The film of claim 1 which has a thickness of from 15 to 800 μm.

17. The film of claim 1 which has a thickness of from 25 to 500 μm.

18. The film of claim 1 which has a thickness of about 450 μm.

19. The film of claim 1, wherein the modified phosphor is present in an amount of 0.05 to 10.00 wt % with respect to the total weight of the composition.

20. The film of claim 1, wherein the modified phosphor is present in an amount of 0.20 to 2.00 wt % with respect to the total weight of the composition.

21. The film of claim 1 which is assembled in a multilayer structure.

* * * * *